United States Patent
Li et al.

(10) Patent No.: US 6,876,263 B1
(45) Date of Patent: Apr. 5, 2005

(54) DUAL VOLTAGE-CONTROLLED OSCILLATOR STRUCTURE WITH POWDER-DOWN FEATURE

(75) Inventors: Wei Li, San Diego, CA (US); Thomas Clark Bryan, San Diego, CA (US); Harry Huy Dang, San Diego, CA (US); Mehmet Mustafa Eker, Santee, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 2 days.

(21) Appl. No.: 10/382,638

(22) Filed: Mar. 5, 2003

(51) Int. Cl.[7] .............................................. H03B 27/00
(52) U.S. Cl. ............................ 331/49; 331/46; 331/185; 331/175; 331/2; 331/16
(58) Field of Search ................................ 331/2, 16, 49, 331/46, 185, 175, 48, 179

(56) References Cited

U.S. PATENT DOCUMENTS

| | | | | |
|---|---|---|---|---|
| 5,389,898 A | * | 2/1995 | Taketoshi et al. | 331/2 |
| 5,856,763 A | * | 1/1999 | Reeser et al. | 331/49 |
| 6,157,265 A | * | 12/2000 | Hanjani | 331/49 |

* cited by examiner

*Primary Examiner*—Arnold Kinkead
(74) *Attorney, Agent, or Firm*—INCAPLAW; Terrance A. Meador

(57) ABSTRACT

A voltage-controlled oscillator ("VCO") structure includes a plurality of VCO circuits, each having a different nominal operating frequency range. Power consumption of the VCO structure is regulated by selective activation/deactivation of the individual VCO circuits. In a preferred embodiment, only one of the VCO circuits is active at any given time. The active VCO can be selected to satisfy the requirements of the particular application and/or to compensate for semiconductor manufacturing process variations.

21 Claims, 3 Drawing Sheets

US 6,876,263 B1

DUAL VOLTAGE-CONTROLLED OSCILLATOR STRUCTURE WITH POWDER-DOWN FEATURE

FIELD OF THE INVENTION

The present invention relates generally to electronic circuits. More particularly, the present invention relates to voltage-controlled oscillator circuits.

BACKGROUND OF THE INVENTION

Many electronic circuits and components, deployed in the context of various applications, employ voltage-controlled oscillators ("VCOs"). A VCO circuit generates a reference output signal having a specific frequency, and the nominal operating frequency range of a practical VCO circuit is dictated by its design. In practice, manufacturing process variation may result in a measurable difference between the actual operating frequency and the nominal operating frequency of a VCO. The process variation can occur from wafer to wafer and over a single semiconductor wafer, where chips located near the edge of the wafer can have different operating characteristics than chips located near the center of the wafer. In some cases, the actual VCO operating frequency range may be out of specification for the particular application, thus resulting in scrapped chips and lower manufacturing yields.

Most circuits designed for network communication are configured to accommodate multi-standard and multi-rate data streams. These circuits utilize dual or multiple VCO circuits. In practical embodiments, all of the multiple VCO circuits remain active at all times, which inherently consumes a significant amount of power due to the need to reduce phase noise or jitter. Such operation results in a waste of power when only one VCO need be active at any given time.

Prior art applications may employ multiple "always active" VCO circuits having multiplexed output signals. Cross-coupling between the multiple VCO output signals can be problematic, especially for high frequency applications. Unwanted cross-coupling results in a noisy VCO output signal.

Accordingly, a need exists for a VCO structure that addresses the above shortcomings and disadvantages of the prior art.

BRIEF SUMMARY OF THE INVENTION

A multiple VCO structure as described herein can be realized on a single semiconductor chip in a manner that compensates for manufacturing process variation and increases manufacturing yield. One of a plurality of VCO circuits on the VCO structure is designated as a valid or active VCO circuit, while the other VCO circuits are disabled or powered down. Consequently, system power resources can be conserved by selecting and activating a VCO circuit that meets operating specifications. The deactivation of the remaining VCO circuits also reduces the amount of output signal cross-talk contained in the VCO output signal.

The above and other aspects of the present invention may be carried out in one form by a multiple VCO structure that includes at least: a plurality of VCO circuits, each having a different nominal operating frequency range, and each being configured to provide a respective VCO output signal; an output selector configured to select one of the VCO output signals in response to an output select signal; and a power-down control architecture configured to regulate power consumption of the VCO circuits in response to a VCO select signal.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware, software, and/or firmware components configured to perform the specified functions. For example, the present invention may employ various integrated circuit components, e.g., transistors, logic elements, and the like. In addition, those skilled in the art will appreciate that the present invention may be practiced in conjunction with any number of applications and that the data communication context described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional techniques related to VCO design and operation, data transmission, logic circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

The following description may refer to nodes, elements, or features being "connected" or "coupled" together. As used herein, unless expressly stated otherwise, "connected" means that one node/feature is directly or indirectly connected to another node/feature, and not necessarily mechanically. Likewise, unless expressly stated otherwise, "coupled" means that one node/feature is directly or indirectly coupled to another node/feature, and not necessarily mechanically. Thus, although the schematics shown in FIG. 1 and FIG. 2 depict example arrangements of elements, additional intervening elements, devices, features, or components may be present in an actual embodiment (assuming that the functionality of the circuits is not adversely affected).

Figure 1:
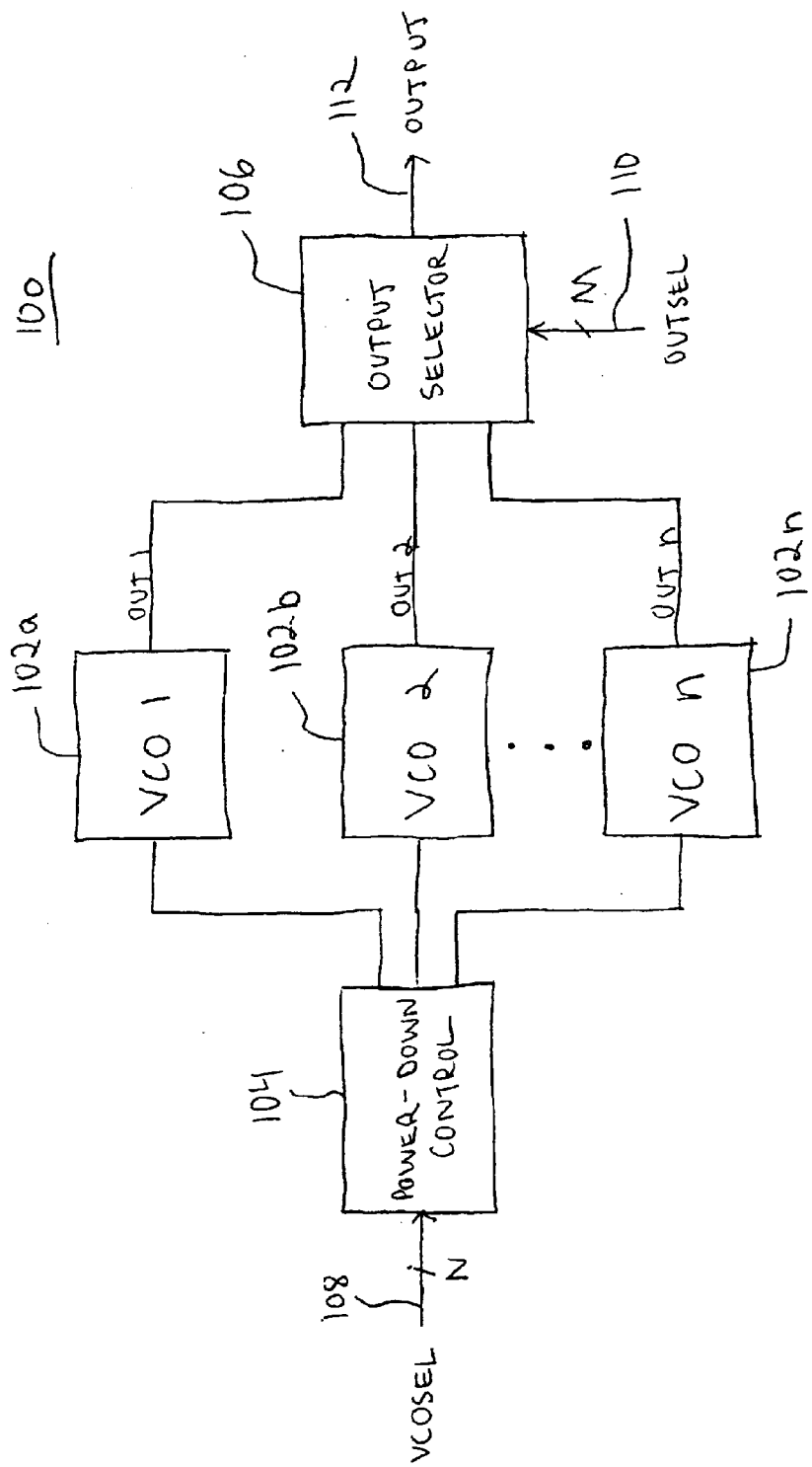
FIG. 1 is a schematic representation of a multiple VCO structure.
Figure 2:
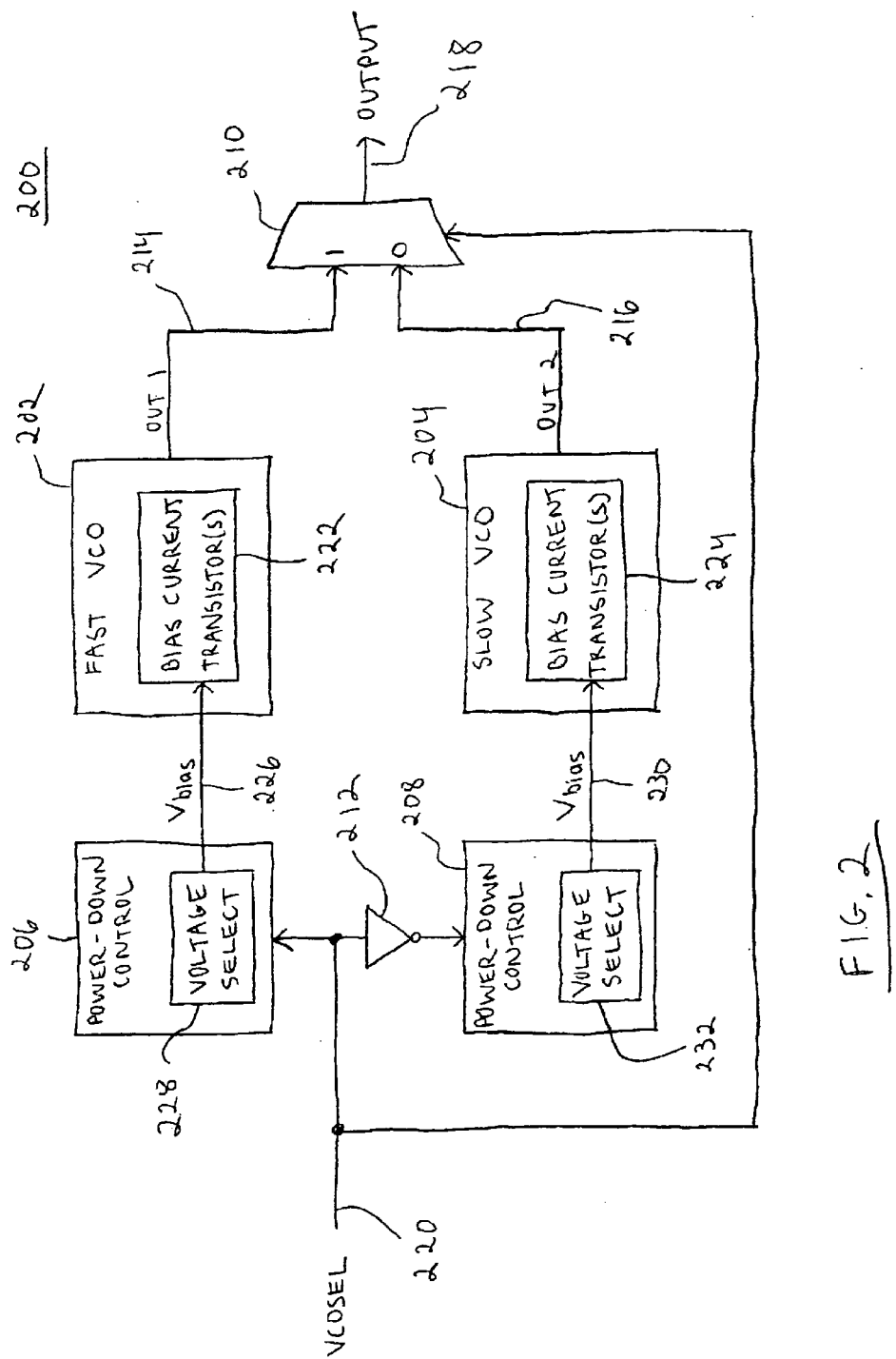
FIG. 2 is a schematic representation of a multiple VCO structure having two VCO circuits.

FIG. 1 is a schematic representation of a multiple VCO structure 100 configured in accordance with the invention. VCO structure 100 generally includes a plurality of VCO circuits 102, a power-down control architecture 104, and an output selector 106. In this example embodiment, power-down control architecture 104 receives a VCO select signal 108 (labeled VCOSEL in FIG. 1), and output selector 106 receives an output select signal 110 (labeled OUTSEL in FIG. 1). In practice, VCO circuits 102, power-down control architecture 104, and output selector 106 are realized on one physical semiconductor chip.

VCO structure 100 may include any number of distinct VCO circuits 102. In this regard, VCO structure 100 is depicted with a first VCO circuit 102a, a second VCO circuit 102b, and so on up to an n-th VCO circuit 102n. The actual number of VCO circuits 102 utilized can vary depending upon the specifications of the practical embodiment. Each VCO circuit 102 has an input port or node that is connected to a respective output port or node of power-down control architecture 104. In the example embodiment, each VCO circuit 102 is directly connected to power-down control architecture 104. Each VCO circuit 102 is configured to generate a respective VCO output signal (labeled OUT1, OUT2, and OUTn in FIG. 1), and the VCO output signals are provided at respective output ports or nodes. In practical embodiments, each VCO circuit 102 is designed according to conventional principles, and each VCO circuit 102 generates an output signal having a stable frequency.

In the example embodiment, each VCO circuit 102 has a different nominal operating frequency range. As used herein, "nominal" means an ideal, theoretical, or designed-for quantity or characteristic, which need not be equal to the "real world" quantity or characteristic that results from actual operation of a practical embodiment. For example, a given VCO circuit 102 may have a nominal operating frequency range between 4 and 6 GHz, but an actual operating frequency range between 3.5 and 5 GHz (caused by manufacturing process variation resulting in "slow" devices) or an actual operating frequency range between 4.5 and 7 GHz (caused by manufacturing process variation resulting in "fast" devices). The nominal operating frequency range of first VCO circuit 102a preferably overlaps the nominal operating frequency range of at least one of the other VCO circuits 102 in VCO structure 100. In a practical embodiment, the nominal operating frequency range of first VCO circuit 102a overlaps the nominal operating frequency range of second VCO circuit 102b, which overlaps the nominal operating frequency range of the next VCO circuit, and so on. As described in more detail below, the different nominal operating frequency ranges of VCO circuits 102 facilitate compensation for manufacturing process variation of the semiconductor chip that embodies VCO structure 100.

VCO structure 100 is suitably configured to manage the amount of power consumed by VCO circuits 102. In this regard, power-down control architecture 104 regulates power consumption of VCO circuits 102 in response to VCO select signal 108. FIG. 1 depicts power-down control architecture 104 as a single block for the sake of simplicity. In practical embodiments, however, power-down control architecture 104 may be realized with any number of functional components, hardware elements, software modules, and/or firmware elements.

Power-down control architecture 104 is configured to activate at least one of the VCO circuits 102 (and to deactivate the remaining VCO circuits 102) in VCO structure 100, thus conserving power resources that would otherwise be consumed by the deactivated VCO circuits. In the preferred embodiment, power-down control architecture 104 activates only one of the VCO circuits 102 while powering down all remaining VCO circuits 102. In accordance with one practical embodiment, power-down control architecture 104 regulates the power consumption of VCO circuits 102 by selecting bias voltages for the bias current transistors utilized by VCO circuits 102. For example, power-down control architecture 104 can provide a sufficient bias voltage to the VCO circuit (or circuits) designated for activation, and an insufficient bias voltage, e.g., zero volts, to the VCO circuit (or circuits) designated for deactivation.

In the example embodiment, power-down control architecture 104 functions in response to VCO select signal 108. As depicted in FIG. 1, VCO select signal 108 can be an N-bit signal, where $N \geq 1$. Power-down control architecture 104 may include circuitry or logic (not shown) for processing VCO select signal 108 in an appropriate manner. In practice, VCO select signal 108 is formatted to identify the active VCO circuit(s) and/or to identify the inactive VCO circuit(s).

Output selector 106 is connected to each VCO circuit 102 such that output selector 106 can select one of the respective VCO output signals in response to output select signal 110. In the example embodiment, each input of output selector 106 is directly connected to an output of a VCO circuit 102. Output selector 106 is configured to select one of its input signals for use as the overall output signal 112 for VCO structure 100.

In the example embodiment, output selector 106 operates in response to output select signal 110. As depicted in FIG. 1, output select signal 110 can be an M-bit signal, where $M \geq 1$. The value of M may, but need not, be equal to the value of N. In practical embodiments, output select signal 110 may be based upon or derived from VCO select signal 108. For example, output select signal 110 and VCO select signal may be a common signal. Output selector 106 can include circuitry or logic (not shown) for processing output select signal 110 in an appropriate manner. In the preferred embodiment, output selector 106 is a multiplexer.

FIG. 2 is a schematic representation of a multiple VCO structure 200 configured in accordance with a preferred embodiment. VCO structure 200 represents one practical implementation of VCO structure 100 that has two different VCO circuits. VCO structure 200 generally includes a first VCO circuit 202, a second VCO circuit 204, a first power-down controller 206, a second power-down controller 208, a multiplexer 210, and an inverter 212. In the practical embodiment of VCO structure 200, VCO circuits 202/204, power-down controllers 206/208, multiplexer 210, and inverter 212 are all realized on one semiconductor chip.

First VCO circuit 202 is configured to generate a first VCO output signal 214 having an oscillation frequency that is dictated by the design of first VCO circuit 202. First VCO circuit 202 has a first nominal operating frequency range corresponding to the theoretical range of oscillation frequencies for first VCO output signal 214. The output of first VCO circuit 202 is connected to one input of multiplexer 210; in the example embodiment, first VCO circuit 202 is directly connected to multiplexer 210. In this example, first output signal 214 is designated as the "1" input to multiplexer 210.

Second VCO circuit 204 is configured to generate a second VCO output signal 216 having an oscillation frequency that is dictated by the design of second VCO circuit 204. Second VCO circuit 204 has a second nominal operating frequency range corresponding to the theoretical range of oscillation frequencies for second VCO output signal 216. The nominal operating frequency of second VCO circuit 204 and the nominal operating frequency of first VCO circuit 202 are designed to overlap each other. For example, in one practical embodiment, each VCO circuit 202/204 has a nominal operating frequency bandwidth of about 2 GHz, and the nominal operating frequency ranges overlap each other by about 500 MHz. The frequency overlap facilitates selection of one of the VCO circuits 202/204 according to the specific application and/or to compensate for manufacturing process variation. The output of second VCO circuit 204 is connected to the other input of multiplexer 210; in the example embodiment, second VCO circuit 204 is directly connected to multiplexer 210. In this example, second output signal 216 is designated as the "0" input to multiplexer 210.

Multiplexer 210 is configured to select, in response to a multiplexer select signal, first or second VCO output signal 214/216 for use as an output 218. In the example embodiment shown in FIG. 2, the multiplexer select signal corresponds to a VCO select signal 220 that also affects the operation of VCO circuits 202/204. Multiplexer 210 functions in a conventional manner: first output signal 214 is selected as output 218 when VCO select signal 220 represents a logic high signal, and second output signal 216 is selected as output 218 when VCO select signal 220 represents a logic low signal.

First power-down controller 206, second power-down controller 208, and inverter 212 form a power-down control architecture that regulates power consumption of VCO circuits 202/204 in response to VCO select signal 220. This power-down control architecture preferably regulates power consumption of VCO circuits 202/204 by selecting bias voltages for the bias current transistors utilized by VCO circuits 202/204. In this regard, FIG. 2 shows the bias current transistor(s) 222 employed by VCO circuit 202 and the bias current transistor(s) 224 employed by VCO circuit 204. In practical embodiments, each VCO circuit 202/204 can employ any number of bias current transistors 222/224 that provide the bias current necessary to support operation of VCO circuits 202/204. The specific design of VCO circuits 202/204, the number of bias current transistors, and the manner in which the bias current is provided to the functional elements of VCO circuits 202/204 may vary from one application to another, and such details are unimportant in the overall context of the invention.

First power-down controller 206 selects a bias voltage 226 for first VCO circuit 202, and is connected to first VCO circuit 202 to provide the bias voltage 226 to first VCO circuit 202. In particular, first power-down controller 206 provides the bias voltage 226 to the bias current transistor(s) 222 in first VCO circuit 202. In the example embodiment, first power-down controller 206 is directly connected to first VCO circuit 202. The specific value of the bias voltage 226 can be determined by a voltage select component 228 of first power-down controller 206. Voltage select component 228 is suitably configured to provide a first voltage that is sufficient to activate bias current transistor(s) 222, or a second voltage that is insufficient to activate bias current transistor(s) 222. Voltage select component 228 may include one or more switching elements, one or more reference voltage elements, and/or other components or elements configured to maintain and select the different voltages. In one practical embodiment, the first voltage is at least as high as the actual threshold voltage for bias current transistor(s) 222, and the second voltage is zero volts.

Second power-down controller 208 selects a bias voltage 230 for second VCO circuit 204, and is connected to second VCO circuit 204 to provide the bias voltage 230 to second VCO circuit 204. In particular, second power-down controller 208 provides the bias voltage 230 to the bias current transistor(s) 224 in second VCO circuit 204. In the example embodiment, second power-down controller 208 is directly connected to second VCO circuit 204. The specific value of the bias voltage 230 can be determined by a voltage select component 232 of second power-down controller 208. Voltage select component 232 is suitably configured to provide a first voltage that is sufficient to activate bias current transistor(s) 224, or a second voltage that is insufficient to activate bias current transistor(s) 224. Voltage select component 232 may include one or more switching elements, one or more reference voltage elements, and/or other components or elements configured to maintain and select the different voltages. In one practical embodiment, the first voltage is at least as high as the actual threshold voltage for bias current transistor(s) 224, and the second voltage is zero volts.

Power-down controllers 206/208 operate in response to VCO select signal 220. In the practical embodiment of VCO structure 200, VCO select signal is a one-bit signal that represents either a logic high or a logic low state. In response to a logic high state of VCO select signal 220, first power-down controller 206 provides the sufficient bias voltage to first VCO circuit 202, while second power-down controller 208 provides zero voltage to second VCO circuit 204. In response to a logic low state of VCO select signal 220, first power-down controller 206 provides zero voltage to first VCO circuit 202, while second power-down controller 208 provides the sufficient bias voltage to second VCO circuit 204. Inverter 212 has an input for VCO select signal 220 and an output for providing an inverted select signal to second power-down controller 208. Each power-down controller 206/208 interprets a logic high control signal as an instruction to activate its respective VCO circuit 202/204. Conversely, each power-down controller 206/208 interprets a logic low control signal as an instruction to deactivate its respective VCO circuit 202/204. Thus, inverter 212 inverts the logic state of VCO select signal 220 such that power-down controllers 206/208 do not activate both VCO circuits 202/204 at the same time.

To summarize, when VCO select signal 220 is high, first VCO circuit 202 is powered up, second VCO circuit 204 is powered down, and multiplexer 210 selects the first VCO output signal 214 as the output 218. Conversely, when VCO select signal 220 is low, first VCO circuit 202 is powered down, second VCO circuit 204 is powered up, and multiplexer 210 selects the second VCO output signal 216 as the output 218. The activation of only one of the two VCO circuits 202/204 conserves power and reduces the amount of cross-coupling between the respective VCO output signals 214/216.

The VCO circuits 202/204 can be selected to compensate for manufacturing process variation that may otherwise result in an out-of-specification device. In this regard, first VCO circuit 202 may be a "fast" VCO that has nominal design characteristics that anticipate a manufacturing process that results in slower than normal devices. In addition, second VCO circuit 204 may be a "slow" VCO that has nominal design characteristics that anticipate a manufacturing process that results in faster than normal devices. If the actual manufacture of VCO structure 200 is a "slow" process, then first VCO circuit 202 can be selected to ensure that its actual operating frequency range falls within specification. On the other hand, if the actual manufacture of VCO structure 200 is a "fast" process, then second VCO circuit 204 can be selected to ensure that its actual operating frequency range falls within specification.

Figure 3:
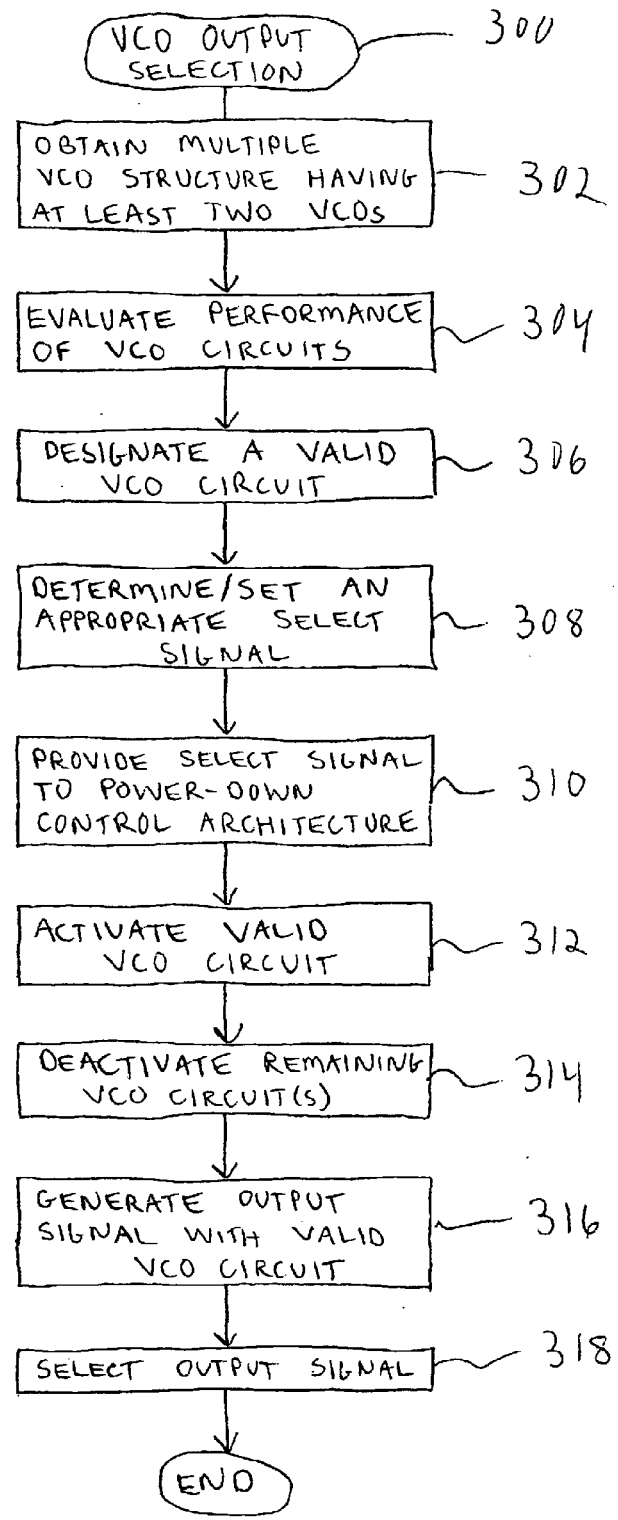
FIG. 3 is a flow diagram of a VCO output selection process.

FIG. 3 is a flow diagram of a VCO output selection process 300 that can be performed to select one of a plurality of VCO circuits for generation of a VCO output signal. Process 300 can be performed at least in part by a VCO structure such as VCO structure 100 or VCO structure 200. Accordingly, a task 302 obtains a multiple VCO structure having at least two VCO circuits. The performance of the VCO circuits are evaluated (task 304) to determine one or more operating characteristics, such as the actual operating frequency ranges of the VCO circuits. Task 304 may be performed by the system or subsystem that incorporates the VCO structure and/or by the VCO structure itself. In some applications, task 304 may be performed with human intervention. For example, task 304 may represent post-manufacture bench testing of the VCO structure prior to actual deployment of the VCO structure.

In response to the evaluation of the VCO circuits, a "valid" VCO circuit is designated (task 306) from among the plurality of possible VCO circuits. In this context, the valid VCO circuit is one that meets the operating specifications of the given application. For example, the valid VCO circuit may be one that satisfies the actual operating frequency range required by the particular system or subsystem. In the preferred embodiment, task 306 designates only one VCO circuit as the valid circuit.

After a suitable VCO circuit has been designated, an appropriate VCO select signal can be determined or set (task 308) for use with the VCO structure. As described above, the format of the VCO select signal may vary depending upon the number of available VCO circuits and/or according to the specific design of the VCO structure. The select signal may be set with a switch or by making a suitable connection to a pin or node at the system or subsystem level. For example, the VCO select signal may be connected to ground to establish a logic low state or to a supply voltage to establish a logic high state. Alternatively, the VCO select signal can dynamically vary in response to any number of criteria, e.g., the operating state of the VCO structure, characteristics of the system or subsystem that incorporates the VCO structure, or the like.

The VCO select signal is provided to the power-down architecture (task 310) to facilitate power management of the VCO structure. In response to the VCO select signal, the valid VCO circuit is activated (task 312) and the remaining VCO circuit(s) are deactivated (task 314). As described above in connection with VCO structure 200, task 312 represents the generation of a bias voltage that is sufficiently high to activate the bias current transistor(s) in the valid VCO circuit, and task 314 represents the generation of a voltage (e.g., zero volts) that is insufficient to activate the bias current transistor(s) in the remaining VCO circuits.

The valid VCO circuit, which is activated and operating in a normal mode, generates a VCO output signal (task 316), and that output signal is selected for use as an output of the VCO structure (task 318). Ideally, the deactivated VCO circuits make no contribution to the output, and the deactivation of the VCO circuits significantly reduces the amount of potential cross-coupling noise. In one practical implementation, the valid VCO circuit is selected once and VCO structure need not be further adjusted. Alternatively, the designation of the valid VCO circuit may be updated from time to time or updated dynamically to ensure proper operation of the VCO structure.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A multiple voltage-controlled oscillator ("VCO") structure comprising:
    a plurality of VCO circuits, each having a different nominal operating frequency range, and each being configured to provide a respective VCO output signal;
    an output selector configured to select one of said respective VCO output signals in response to an output select signal; and
    a power-down control architecture configured to regulate power consumption of said plurality of VCO circuits in response to a VCO select signal; wherein said power down control architecture regulates power consumption of said plurality of VCO circuits by selecting bias voltages for bias current transistors utilized by said plurality of VCO circuits; and wherein
    said plurality of VCO circuits are realized on one semiconductor chip; and
    said different nominal operating frequency ranges facilitate compensation for manufacturing process variation of said semiconductor chip.

2. A VCO structure according to claim 1, wherein said output select signal is an M-bit signal, and M≧1.

3. A VCO structure according to claim 1, wherein said output select signal is based upon said VCO select signal.

4. A VCO structure according to claim 3, wherein said output select signal corresponds to said VCO select signal.

5. A VCO structure according to claim 1, wherein the nominal operating frequency range of a first VCO circuit from said plurality of VCO circuits overlaps the nominal operating frequency range of at least one other VCO circuit from said plurality of VCO circuits.

6. A VCO structure according to claim 1, wherein said output selector is a multiplexer.

7. A multiple voltage-controlled oscillator ("VCO") structure comprising:
    a first VCO circuit having a first nominal operating frequency range, said first VCO circuit being configured to provide a first VCO output signal;
    a second VCO circuit having a second nominal operating frequency range that overlaps said first nominal operating frequency range, said second VCO circuit being configured to provide a second VCO output signal;
    a multiplexer configured to select, in response to a select signal, said first VCO output signal or said second VCO output signal for use as an output; and
    a power-down control architecture configured to regulate power consumption of said first VCO circuit and said second VCO circuit in response to said select signal, said power-down control architecture including:
        a first power-down controller having a voltage select component configured to provide a first voltage that is sufficient to activate bias current transistor(s) utilized by said first VCO circuit, or a second voltage that is insufficient to activate bias current transistor(s) utilized by said first VCO circuit; and
        a second power-down controller having a voltage select component configured to provide a third voltage that is sufficient to activate bias current transistor(s) utilized by said second VCO circuit, or a fourth voltage that is insufficient to activate bias current transistor(s) utilized by said second VCO circuit.

8. A VCO structure according to claim 7, wherein said power-down control architecture regulates power consumption of said VCO circuits by selecting bias voltages for bias current transistors utilized by said VCO circuits.

9. A VCO structure according to claim 7, wherein said first VCO circuit and said second VCO circuit are realized on one semiconductor chip.

10. A VCO structure according to claim 9, wherein said first nominal operating frequency range and said second nominal operating frequency range facilitate compensation for manufacturing process variation of said semiconductor chip.

11. A VCO structure according to claim 7, wherein:
said first power-down controller provides said first voltage to said first VCO circuit in response to a first logic state of said select signal;
said second power-down controller provides said fourth voltage to said second VCO circuit in response to said first logic state of said select signal;
said first power-down controller provides said second voltage to said first VCO circuit in response to a second logic state of said select signal; and
said second power-down controller provides said third voltage to said second VCO circuit in response to said second logic state of said select signal.

12. A VCO structure according to claim 11, further comprising an inverter having an input for said select signal and an output for providing an inverted select signal to said second power-down controller.

13. A method for generating a voltage-controlled oscillator ("VCO") output, said method comprising:
designating a valid VCO circuit, from a plurality of VCO circuits, each having a different nominal operating frequency range, and each being configured to provide a respective VCO output signal;
activating said valid VCO circuit in response to a VCO select signal;
deactivating said plurality of VCO circuits, other than said valid VCO circuit, in response to said VCO select signal;
generating an active VCO output signal with said valid VCO circuit; and
selecting said active VCO output signal; wherein said activating and deactivating of said plurality of VCO circuits is done by generating bias voltages for bias current transistors utilized by said plurality of VCO circuits; and wherein
said plurality of VCO circuits are realized on one semiconductor chip; and
said different nominal operating frequency ranges facilitate compensation for manufacturing process variation of said semiconductor chip.

14. A method according to claim 13, wherein said activating and deactivating steps regulate power consumption of said plurality of VCO circuits in response to said VCO select signal.

15. A method according to claim 13, wherein activating said valid VCO circuit comprises:
generating a voltage that is sufficient to activate bias current transistor(s) utilized by said valid VCO circuit; and
providing said voltage to said bias current transistor(s).

16. A method according to claim 13, wherein deactivating said plurality of VCO circuits comprises:
generating a voltage that is insufficient to activate bias current transistor(s) utilized by said plurality of VCO circuits; and
providing said voltage to said bias current transistor(s).

17. A method according to claim 13, wherein said active VCO output signal is selected in response to an output select signal.

18. A method according to claim 17, wherein said output select signal is based upon said VCO select signal.

19. A method according to claim 18, wherein said output select signal corresponds to said VCO select signal.

20. A method according to claim 13, wherein the nominal operating frequency range of a first VCO circuit from said plurality of VCO circuits overlaps the nominal operating frequency range of at least one other VCO circuit from said plurality of VCO circuits.

21. A multiple voltage-controlled oscillator ("VCO") structure comprising:
a plurality of VCO circuits realized on one semiconductor chip, each having a different nominal operating frequency range to facilitate compensation for manufacturing process variation of said semiconductor chip, and each being configured to provide a respective VCO output signal;
a power-down control architecture configured to activate a first VCO circuit from said plurality of VCO circuits and to deactivate said plurality of VCO circuits other than said first VCO circuit, in response to a VCO select signal; wherein said power down control architecture regulates power consumption of said plurality of VCO circuits by selecting bias voltages for bias current transistors utilized by said plurality of VCO circuits; and
an output selector configured to select, in response to an output select signal, a first VCO output signal from said respective VCO output signals, said first VCO output signal being generated by said first VCO circuit.

* * * * *